(12) United States Patent
Karlsson

(10) Patent No.: US 7,570,493 B2
(45) Date of Patent: Aug. 4, 2009

(54) PRINTED CIRCUIT BOARD WITH EMBEDDED CIRCUIT COMPONENT

(75) Inventor: Ulf G. Karlsson, Höllviken (SE)

(73) Assignee: Sony Ericsson Mobile Communications, Lund (SE)

( * ) Notice: Subject to any disclaimer, the term of this patent is extended or adjusted under 35 U.S.C. 154(b) by 287 days.

(21) Appl. No.: 11/560,382

(22) Filed: Nov. 16, 2006

(65) Prior Publication Data

US 2008/0117606 A1    May 22, 2008

(51) Int. Cl.
*H05K 7/00* (2006.01)
(52) U.S. Cl. .................. 361/760; 361/763; 361/764; 174/264; 174/265
(58) Field of Classification Search ............. 361/760, 361/763, 764; 174/264–268
See application file for complete search history.

(56) References Cited

U.S. PATENT DOCUMENTS

| | | | |
|---|---|---|---|
| 4,300,115 A * | 11/1981 | Ansell et al. ............... 338/314 |
| 4,945,399 A | 7/1990 | Brown et al. |
| 5,272,600 A | 12/1993 | Carey |
| RE35,064 E | 10/1995 | Hernandez |
| 5,459,368 A * | 10/1995 | Onishi et al. ............ 310/313 R |
| 5,773,889 A | 6/1998 | Love et al. |
| 6,021,050 A * | 2/2000 | Ehman et al. ............... 361/793 |
| 6,200,400 B1 | 3/2001 | Farooq et al. |
| 6,700,203 B1 | 3/2004 | Cabral, Jr. et al. |
| 6,737,749 B2 | 5/2004 | Tomsio et al. |
| 6,828,232 B2 | 12/2004 | Cabral, Jr. et al. |
| 6,981,239 B2 | 12/2005 | Masuyama et al. |
| 7,034,633 B2 | 4/2006 | Passiopoulos et al. |
| 7,056,800 B2 | 6/2006 | Croswell et al. |
| 7,092,237 B2 | 8/2006 | Lee et al. |
| 2002/0024801 A1 | 2/2002 | Hung et al. |
| 2002/0175748 A1 | 11/2002 | Nishikawa |
| 2003/0076197 A1 | 4/2003 | Novak et al. |
| 2003/0116856 A1 | 6/2003 | Tomsio et al. |
| 2004/0094843 A1 | 5/2004 | Cabral, Jr. et al. |
| 2004/0104438 A1 * | 6/2004 | Cabral et al. ............... 257/364 |

(Continued)

FOREIGN PATENT DOCUMENTS

EP    0491543    6/1992

OTHER PUBLICATIONS

International Search Report and Written Opinion from corresponding International Application No. PCT/IB07/001138.

*Primary Examiner*—Dean A. Reichard
*Assistant Examiner*—Andargie M Aychillhum
(74) *Attorney, Agent, or Firm*—Renner, Otto, Boisselle & Sklar, LLP

(57) ABSTRACT

In one embodiment, a printed circuit board includes a plurality of insulating layers in which an aperture is formed through some of the layers. A resistive plug at least partially fills the aperture and contacts respective conductive members at each end of the resistive plug to form a resistive via that traverses partially through the printed circuit board. In another embodiment, a printed circuit board includes a plurality of insulating layers in which an aperture is formed through at least some of the layers. A dielectric plug at least partially fills the aperture and contacts respective conductive members at each end of the dielectric plug to form a capacitive via that traverses at least partially through the printed circuit board.

11 Claims, 1 Drawing Sheet

U.S. PATENT DOCUMENTS

| | | |
|---|---|---|
| 2004/0165361 A1* | 8/2004 | Kimura et al. ............... 361/763 |
| 2004/0187297 A1 | 9/2004 | Su et al. |
| 2004/0238949 A1 | 12/2004 | Iijima et al. |
| 2005/0244999 A1* | 11/2005 | Masuyama et al. .......... 438/106 |
| 2006/0163570 A1 | 7/2006 | Renn et al. |
| 2006/0176350 A1 | 8/2006 | Howarth et al. |

* cited by examiner

U.S. Patent  Aug. 4, 2009  US 7,570,493 B2
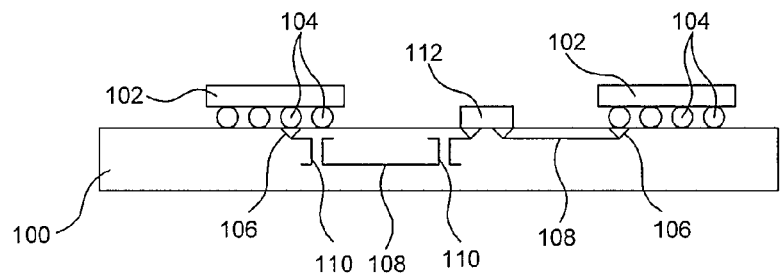
FIG. 1
Prior Art
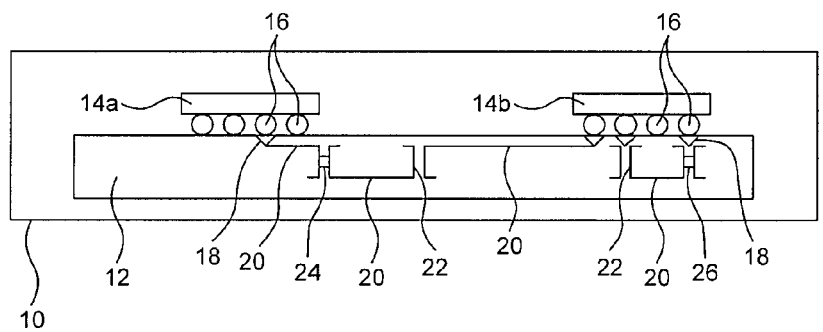
FIG. 2
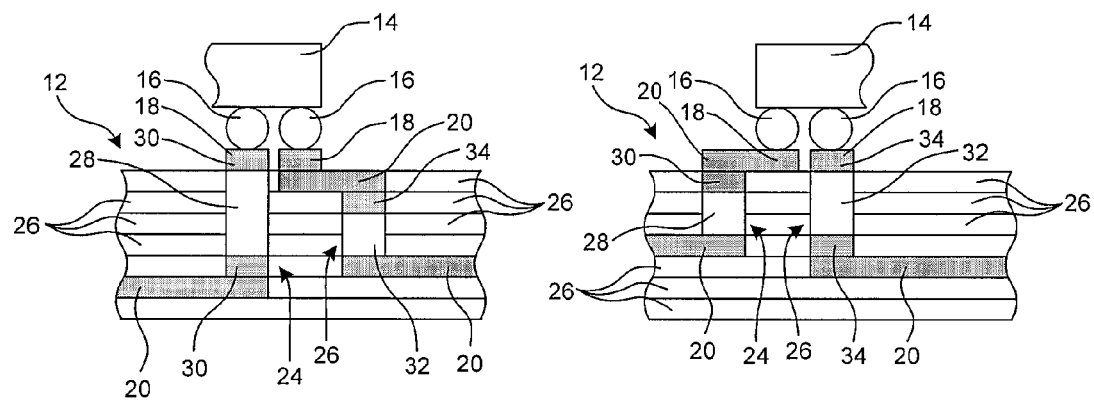
FIG. 3  FIG. 4
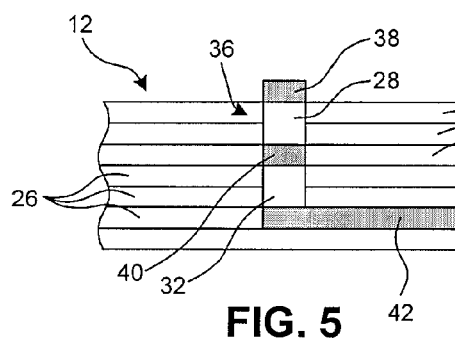
FIG. 5
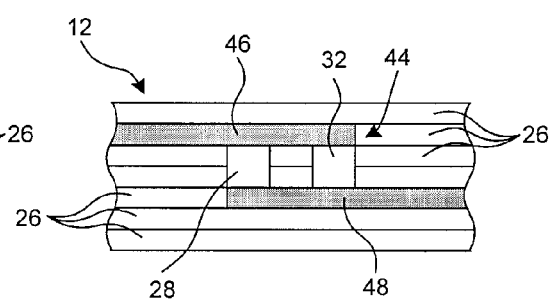
FIG. 6

PRINTED CIRCUIT BOARD WITH EMBEDDED CIRCUIT COMPONENT

TECHNICAL FIELD OF THE INVENTION

The present invention relates generally to electronic devices that include a printed circuit board and, more particularly, to a printed circuit board that has an embedded circuit component in the form of a resistive via, a capacitive via and/or a resistive and capacitive via.

DESCRIPTION OF THE RELATED ART

Many electronic devices such as mobile telephones, computers, game players and so forth include printed circuit boards. Printed circuit boards also may be referred to as printed wire boards. The printed circuit board may retain one or more active circuit components (e.g., integrated circuit packages) and may establish connectivity to contacts of the circuit components. For instance, the printed circuit board may include conductive electrical pathways to connect the circuit component to power and/or ground. In addition, the printed circuit board may include conductive electrical pathways to connect the circuit component to another active component that is mounted on the printed circuit board (e.g., another integrated circuit package) or another active component that is located off of the printed circuit board so that signals may be exchanged between the circuit component and these other components.

The pathways between one active circuit component and another active component, power and/or ground may include passive components such as resistors and/or capacitors that are also mounted to the printed circuit board. Also, the pathways themselves may be coupled to power or ground by resistors and/or capacitors that are mounted to the printed circuit board.

With reference to FIG. 1, a typical multilayer printed circuit board 100 is schematically illustrated. Mounted to the printed circuit board 100 are two integrated circuit packages 102 that have a ball grid array (BGA) form factor. Solder balls 104 are used to couple contacts of the integrated circuit packages 102 to conductive pads 106 (sometimes referred to as lands) of the printed circuit board 100. The conductive pads 106 are connected to surface mounted and/or buried conductive traces 108 that fan out from the integrated circuit packages 102 to establish electrical connectivity to other locations. Conductive vias 110 are used to establish electrical connectivity between outer layers of the printed circuit board 100 and inner layers of the printed circuit board 100.

One or more passive components 112, such as resistors and/or capacitors, are mounted on a surface of the printed circuit board 100. Traces 108 and/or vias 110 are used to incorporate the passive component 112 in the pathway between the integrated circuit package 102 and another node (e.g., power, ground or another active component such as another integrated circuit package 102).

The passive components consume space on the printed circuit board. Also, the passive components add complexity to the design of the printed circuit board as each passive component increases the number of traces and/or vias present in conjunction with the printed circuit board.

SUMMARY

To improve printed circuit boards, there is a need in the art for a printed circuit board that reduces the number of surface mounted components, that reduces the number of vias and traces, and/or makes more efficient use of the space consumed by vias.

According to one aspect of the invention, a printed circuit board includes a plurality of insulating layers in which an aperture is formed through some of the layers, and a resistive plug that at least partially fills the aperture and contacts respective conductive members at each end of the resistive plug to form a resistive via that traverses partially through the printed circuit board.

According to one embodiment of the printed circuit board, the resistive via is a blind via such that the resistive plug is not covered by any of the insulating layers at one end and is covered by at least one insulating layer at an opposite end.

According to one embodiment of the printed circuit board, the conductive layer at the end of the resistive plug that is uncovered by an insulating layer functions as a land for an electrical component that is mounted to the printed circuit board.

According to one embodiment of the printed circuit board, the resistive via is a buried via such that each end of the resistive plug is covered by at least one insulating layer.

According to one embodiment, the printed circuit board further includes an electrical component mounted to the printed circuit board and the electric component is electrically coupled to one of another electrical component, power or ground with the resistive via.

According to one embodiment, the printed circuit board further includes a conductive trace used to carry a signal from one node to another node and the conductive trace is electrically coupled to power or ground with the resistive via.

According to one embodiment, the printed circuit board further includes a capacitive via formed from a dielectric plug disposed in a second aperture that traverses at least some of the insulating layers.

According to one embodiment, the printed circuit board further includes a second resistive plug and a dielectric plug that combine to form an resistive and capacitive via that forms an RC circuit.

According to one embodiment of the printed circuit board, the printed circuit board is part of an electronic device.

According to one embodiment of the printed circuit board, the electronic device is a mobile radio terminal.

According to another aspect of the invention, a printed circuit board includes a plurality of insulating layers in which an aperture is formed through at least some of the layers, and a dielectric plug that at least partially fills the aperture and contacts respective conductive members at each end of the dielectric plug to form a capacitive via that traverses at least partially through the printed circuit board.

According to one embodiment of the printed circuit board, the capacitive via is a through via that is not covered by any of the insulating layers on either end of the dielectric plug.

According to one embodiment of the printed circuit board, the capacitive via is a blind via such that the dielectric plug is not covered by any of the insulating layers at one end and is covered by at least one insulating layer at an opposite end.

According to one embodiment of the printed circuit board, the conductive layer at the end of the dielectric plug that is uncovered by an insulating layer functions as a land for an electrical component that is mounted to the printed circuit board.

According to one embodiment of the printed circuit board, the capacitive via is a buried via such that each end of the dielectric plug is covered by at least one insulating layer.

According to one embodiment, the printed circuit board further includes an electrical component mounted to the printed circuit board and the electric component is electrically coupled to one of another electrical component, power or ground with the capacitive via.

According to one embodiment, the printed circuit board further includes a conductive trace used to carry a signal from one node to another node and the conductive trace is electrically coupled to power or ground with the capacitive via.

According to one embodiment of the printed circuit board, the printed circuit board is part of an electronic device.

According to one embodiment of the printed circuit board, the electronic device is a mobile radio terminal.

According to yet another aspect of the invention, a printed circuit board includes a plurality of insulating layers in which an aperture is formed through at least some of the layers, and a resistive plug and a dielectric plug that are arranged in series in the aperture, the resistive and dielectric plugs forming a resistive and capacitive via that traverses at least partially through the printed circuit board.

According to one embodiment, the printed circuit board further includes a conductive member interposed between the resistive plug and the dielectric plug.

According to still another aspect of the invention, a printed circuit board includes a plurality of insulating layers, and a resistive plug and a dielectric plug that are arranged adjacent each other such that each plug traverses one or more of the insulating layers and wherein first ends of the plugs contact a first conductive member and second ends of the plugs contact a second conductive member so that the plugs are arranged in parallel and form a resistive and capacitive via that traverses at least partially through the printed circuit board.

According to one embodiment of the printed circuit board, the resistive plug and the dielectric plug are separated by insulating material.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto.

Features that are described and/or illustrated with respect to one embodiment may be used in the same way or in a similar way in one or more other embodiments and/or in combination with or instead of the features of the other embodiments.

It should be emphasized that the terms "comprises" and "comprising," when used in this specification, are taken to specify the presence of stated features, integers, steps or components but do not preclude the presence or addition of one or more other features, integers, steps, components or groups thereof.

BRIEF DESCRIPTION OF THE DRAWINGS

FIG. 1 is a schematic view of a conventional multilayer printed circuit board;

FIG. 2 is a schematic view of an electronic device that includes a printed circuit board in accordance with an embodiment of the present invention;

FIG. 3 is a schematic view of a portion of a printed circuit board that includes vias in accordance with various embodiments of the present invention;

FIG. 4 is a schematic view of a portion of a printed circuit board that includes vias in accordance with various embodiments of the present invention;

FIG. 5 is a schematic view of a portion of a printed circuit board that includes a series resistive and capacitive via in accordance with an embodiment of the present invention; and FIG. 6 is a schematic view of a portion of a printed circuit board that includes a parallel resistive and capacitive via in accordance with an embodiment of the present invention.

DETAILED DESCRIPTION OF EMBODIMENTS

Embodiments of the present invention will now be described with reference to the drawings, wherein like reference numerals are used to refer to like elements throughout. It will be understood that the figures are not necessarily to scale.

In the present application, the invention is described primarily in the context of a printed circuit board for a mobile telephone. However, it will be appreciated that the invention is not intended to be limited to the context of a mobile telephone and may relate to a printed circuit board for any type of electronic equipment. Non-limiting examples of other types of electronic equipment include a media player, a gaming device, a computer, a video monitor, and an appliance. Also, the interchangeable terms "electronic equipment" and "electronic device" include portable radio communication equipment. The term "portable radio communication equipment," which herein after is referred to as a "mobile radio terminal," includes all equipment such as mobile telephones, pagers, communicators, electronic organizers, personal digital assistants (PDAs), smartphones, portable communication apparatus or the like.

Referring to FIG. 2, shown is an electronic device 10 that includes a printed circuit board 12. The electronic device 10 may be any type of device that has electrical components that are mounted to the printed circuit board 12. An exemplary electronic device 10 is a mobile telephone that includes call circuitry, control circuitry, a processor, a memory, audio circuitry, video circuitry and so forth. Components that implement these circuits and devices may be mounted to the printed circuit board 12.

In the illustrated example, the electrical components that are mounted to the printed circuit board 12 are integrated circuit packages 14a and 14b. The integrated circuit packages 14 may be configured as ball grid arrays (BGAs) that are electrically and mechanically coupled to the printed circuit board with solder balls 16. Other form factors for the electrical components that are mounted to the printed circuit board 12 are possible. The solder balls 16 of the illustrated embodiments connect to conductive pads 18, which also may be referred to as lands 18. Conductive traces 20 and/or conductive vias 22 may be used to establish an electrical pathway from one land 18 to another land 18, from one land 18 to power or ground, or from one land 18 to a connector (not shown) through which an electrical component located off of the printed circuit board 12 interfaces to the components mounted to the printed circuit board 12.

The printed circuit board 12 may be a multilayered printed circuit board. As will be appreciated, a multilayered circuit board may be constructed by laminating or stacking insulating sheets or layers upon one another. Conductive lines and/or structures may be formed on the top and/or bottom of selected layers to form the conductive traces 20 and conductive planes (e.g., for the establishment of a power plane and/or a ground plane). Thus, the conductive traces 20 and/or planes may be buried between layers of the printed circuit board 12 as well as on exterior surfaces of the printed circuit board 12.

The conductive vias 22 may traverse one or more layers to establish conductivity between conductive members, including lands 18, traces 20, power planes and a ground planes. The conductive vias may be formed by drilling (e.g., laser drilling) or etching through the layers and then filling the resulting aperture. In one construction method, the apertures may be formed in individual layers before the layers are stacked. Once stacked, the previously formed apertures align and the resulting void may be filled or lined with conductive material, such as copper. In another construction method, the layers may be stacked and then the aperture for the via 22 may be formed through one or more layers by drilling or etching.

The vias 22 may include through vias that traverse from an upper surface of the printed circuit board 12 to a lower surface of the printed circuit board 12. The vias 22 also may include buried vias that traverse through one or more layers, but do not reach either surface of the printed circuit board 12. For instance, the buried vias may be covered on both ends by one or more insulating layers of the printed circuit board 12. The vias 22 also may include blind vias that traverse through one or more layers and reach one surface of the printed circuit board 12, but not the opposing surface of the printed circuit board 12. Blind vias may include a conductive cap layer to function as a land 18.

With continued reference to FIG. 2 and additional reference to FIGS. 3 and 4, the printed circuit board 12 may include resistive vias 24 and/or capacitive vias 26 in addition to the conductive vias 22. The resistive vias 24 may be formed in similar manner to the conductive vias 22, but the aperture through one or more insulating layers 26 of the printed circuit board 12 is filled with and/or lined with resistive material that forms a resistive plug 28. The resistive material may be, for example, a resistive paste, ink, fill or thin film. Examples of resistive material include DuPont Intera, Ohmega-ply, Mac-Dermid M-Pass, polymer thick film (PTF), Shipley Insite, nickel phosphorus (NiP), and lanthanum hexaboride $LaB_6$. The resistive material may have a resistance greater than the conductive vias 22, the conductive planes, the lands 18 and/or the traces 22. For instance, the resistive via 22 may have a resistance of about 10 ohms to about 1 mega-ohm. In one embodiment, the resistance is about 10 ohms to about 10,000 ohms and, in one embodiment, the resistance is about 100,000 ohms to about 1 mega-ohm. The resistive vias 24 may include a conductive cap 30 that contacts an upper end of the resistive plug 28 and/or a conductive cap 30 that contacts a lower end of the resistive plug 28.

In the embodiment of FIG. 3, the resistive via 24 is arranged as a blind via and the conductive cap 30 also serves as a land 18 for an electrical component (e.g., the integrated circuit package 14) that is mounted to the circuit board 10. In the illustrated example, the integrated circuit package 14 is connected to the upper cap 30 with one of the solder balls 16. The lower cap 30 at the opposite end of the resistive plug 28 contacts a trace 20. In other embodiments, the upper cap 30 and/or the lower cap 30 may be omitted and electrical contact to the resistive plug 28 is made directly with a plane, a trace 20 or a land 18. For instance, in the embodiment of FIG. 4 the resistive via 24 is arranged as a buried via and a trace 20 contacts the lower end of the resistive plug 28 of the resistive via 24. In other embodiments, the resistive via 24 may be a through via.

The lower cap 30, if present, may be formed by partially filling or lining an aperture for the resistive via 24 with conductive material, such as copper. The conductive plug 28 may then be formed over the lower cap 30 by inserting resistive material into the aperture. If an upper cap 30 is to be formed, some of the volume at the top of the aperture may remain unfilled with resistive material to accommodate additional conductive material (e.g., copper) for the upper cap 30. Alternatively, some of the resistive material may be removed by etching or drilling and the resulting void may be filled or lined with conductive material to form the upper cap 30. In yet other embodiments, the caps 30 may be formed using techniques commonly used for creating conductive planes, traces 20 and/or lands 18, such as by printing or screening. In other embodiments, the caps 30 may form a full or partial annular rings around the respective ends of the resistive plug 28. The caps 30 and/or the resistive plug 28 may have any suitable thickness and/or sectional area.

With continued reference to FIGS. 3 and 4, capacitive vias 26 may be formed in similar manner to the conductive vias 22 and/or the resistive vias 24. For the capacitive vias 26, the aperture through one or more insulating layers 26 of the printed circuit board 12 is filled with and/or lined with material having a relatively high dielectric constant to form a dielectric plug 32. The dielectric material may be, for example, barium titanate ($BaTiO_3$) (having a dielectric constant of about 10,000 to about 15,000), strontium titanate ($SrTiO_3$), lanthanum-doped lead zirconate titanate (PZT) (having a dielectric constant of about 10,000), a class 2 ceramic dielectric, or any other suitable material. The capacitive vias 26 may include a conductive cap 34 that contacts an upper end of the dielectric plug 32 and/or a conductive cap 34 that contacts a lower end of the dielectric plug 32.

In the embodiment of FIG. 4, the capacitive via 26 is arranged as a blind via and the conductive cap 34 also serves as a land 18 for an electrical component (e.g., the integrated circuit package 14) that is mounted to the circuit board 10. In the illustrated example, the integrated circuit package 14 is connected to the cap 34 with one of the solder balls 16. The lower cap 34 at the opposite end of the dielectric plug 32 contacts a trace 20. In other embodiments, the upper cap 34 and/or the lower cap 34 may be omitted and electrical contact to the dielectric plug 32 is made directly with a plane, a trace 20 or a land 18. For instance, in the embodiment of FIG. 3 the capacitive via 26 is arranged as a buried via and a trace 20 contacts the lower end of the dielectric plug 32 of the capacitive via 26. In other embodiments, the capacitive via 26 may be a through via.

The lower cap 34, if present, may be formed by partially filling or lining an aperture for the capacitive via 26 with conductive material, such as copper. The dielectric plug 32 may then be formed over the lower cap 34 by inserting dielectric material into the aperture. If an upper cap 34 is to be formed, some of the volume at the top of the aperture may remain unfilled with dielectric material to accommodate additional conductive material (e.g., copper) for the upper cap 34. Alternatively, some of the dielectric material may be removed by etching or drilling and the resulting void may be filled or lined with conductive material to form the upper cap 34. In yet other embodiments, the caps 34 may be formed using techniques commonly used for creating conductive planes, traces 20 and/or lands 18, such as by printing or screening. In other embodiments, the caps 34 may form a full or partial annular rings around the respective ends of the dielectric plug 32. The caps 34 and/or the dielectric plug 28 may have any suitable thickness and/or sectional area.

With additional reference to FIG. 5, a resistive and capacitive via 36 that forms an RC circuit is illustrated. The resistive and capacitive via 36 is arranged as a blind via, but could be reconfigured as a buried via or a through via. The resistive and capacitive via 36 includes a resistive component and a capacitive component arranged in series. For instance a conductive member 38 (e.g., a trace, land, cap or plane) may contact an upper end of a resistive plug 28. A lower end of the resistive plug 28 may contact another conductive member 40 (e.g., a trace, land, cap or plane) that, in turn, contacts an upper end of a dielectric plug 32. The lower end of the dielectric plug 32 contacts a third conductive member 42 (e.g., a trace, land, cap or plane). In the illustrated embodiment, the resistive plug 28, the conductive member 40 and the dielectric plug 32 are stacked in an aperture formed in one or more layers 26 of the printed circuit board 12. The conductive member 38 and/or the conductive member 42 also may be fully or partially disposed in the aperture. It will be appreciated that the resistive plug 28 may be switched with the dielectric plug 32 and/or the resistive plug 28 may directly contact the dielectric plug 32.

With additional reference to FIG. 6, another embodiment of a resistive and capacitive via 44 that forms an RC circuit is illustrated. The resistive and capacitive via 44 is arranged as a buried via, but could be reconfigured as a blind via or a through via. The resistive and capacitive via 44 includes a resistive component and a capacitive component arranged in parallel. For instance a unitary conductive member 46 (e.g., a trace, land, cap or plane) may contact each of an upper end of a resistive plug 28 and an upper end of a dielectric plug 32. A lower end of the resistive plug 28 and a lower end of the dielectric plug 32 may each contact another unitary conductive member 48 (e.g., a trace, land, cap or plane). In the illustrated embodiment, the resistive plug 28 and the dielectric plug 32 are separated by insulating material, such as insulating material from the layers 26. For instance, adjacent apertures may be formed in one or more of the layers 26 and the apertures may be respectively filled with resistive material and dielectric material. The conductive member 46 and/or the conductive member 48 also may be fully or partially disposed in the apertures. In another embodiment, the resistive material, the dielectric material and insulating material to separate the resistive material and dielectric material are placed in a single aperture that is formed in one or more of the layers 26. If applicable, conductive material for the members 46 and/or 48 may be placed in such an aperture. In another embodiment, the insulating material to separate the resistive material and the dielectric material may be omitted such that a side of the resistive plug 28 and a side of the dielectric plug 32 contact each other.

In FIGS. 3 to 6, traces 30, lands 18, caps 30 and caps 34 are illustrated as being the same thickness as insulating layers 26 of the printed circuit board 10 to facilitate illustration of features of the present invention. As will be appreciated, however, these conductive components need not be the same thickness and may be printed or otherwise formed on a surface of one of the layers 26 and or to fill an aperture in one or more layers 26. Thus, the illustration of conductive material commensurate in thickness with a layer 26 of insulating material is for descriptive purposes and may not accurately represent all embodiments of a printed circuit board constructed in accordance with one or more aspects of the present invention.

The resistive vias 24, the capacitive vias 26, the series resistive and capacitive vias 36 and/or the parallel resistive and capacitive vias 44 may be used to electrically couple an electric component to one of another electrical component, power or ground. Alternatively, the resistive vias 24, the capacitive vias 26, the series resistive and capacitive vias 36 and/or the parallel resistive and capacitive vias 44 may be used to electrically couple a conductive trace (e.g., a line that carries a signal from one node to another node) to power or ground.

As will be appreciated, the resistive vias, the capacitive vias and/or the resistive and capacitive vias described herein may result in the reduced used of resistor and/or capacitor components that are mounted to a surface of a printed circuit board. A corresponding reduction in space used to accommodate the components mounted to the printed circuit board may be achieved. As a result, smaller printed circuit boards and smaller electrical devices that include printed circuit boards may be realized. Cost reductions also may be realized as a result of reducing the reliance on surface mounted resistor and/or capacitor components. In addition, the designing of a printed circuit board for a specific application may be easier and take less time than currently experienced.

Although the invention has been shown and described with respect to certain preferred embodiments, it is understood that equivalents and modifications will occur to others skilled in the art upon the reading and understanding of the specification. The present invention includes all such equivalents and modifications, and is limited only by the scope of the following claims.

What is claimed is:

1. A printed circuit board, comprising:
   a plurality of insulating layers in which an aperture is formed through at least some of the layers, and
   a resistive plug and a dielectric plug that are arranged in series in the aperture, a first conductive member contacting a first end of the resistive plug, a second end of the resistive plug electrically contacting a first end of the dielectric plug, and a second end of the dielectric plug contacting a second conductive member, the resistive and dielectric plugs and the conductive members forming a series resistive and capacitive via that traverses at least partially through the printed circuit board.

2. The printed circuit board of claim 1, further comprising a third conductive member located in the aperture and interposed between the resistive plug and the dielectric plug so that the resistive plug and the dielectric plug electrically contact each other through the third conductive member.

3. The printed circuit board of claim 1, wherein the resistive and capacitive via is one of a through via, a blind via or a buried via.

4. The printed circuit board of claim 1, wherein the resistive plug and the dielectric plug directly contact each other to establish the electrical contact between the plugs.

5. The printed circuit board of claim 1, wherein the printed circuit board is part of an electronic device.

6. The printed circuit board of claim 5, wherein the electronic device is a mobile radio terminal.

7. A printed circuit board, comprising:
   a plurality of insulating layers, and
   a resistive plug and a dielectric plug that are arranged adjacent each other such that each plug traverses one or more of the insulating layers and wherein first ends of the plugs directly contact a first conductive member and second ends of the plugs directly contact a second conductive member so that the plugs are arranged in parallel and collectively form a resistive and capacitive via that traverses at least partially through the printed circuit board.

8. The printed circuit board of claim 7, wherein the resistive plug and the dielectric plug are separated by insulating material.

9. The printed circuit board of claim 7, wherein the resistive and capacitive via is one of a through via, a blind via or a buried via.

10. The printed circuit board of claim 7, wherein the printed circuit board is part of an electronic device.

11. The printed circuit board of claim 10, wherein the electronic device is a mobile radio terminal.

* * * * *